United States Patent

Bates et al.

Patent Number: 5,932,043
Date of Patent: Aug. 3, 1999

[54] METHOD FOR FLAT FIRING ALUMINUM NITRIDE/TUNGSTEN ELECTRONIC MODULES

[75] Inventors: Richard Allen Bates, Wappingers Falls, N.Y.; Carla Natalia Cordero, Colchester, Vt.; Benjamin Vito Fasano, New Windsor, N.Y.; David Brian Goland, Sopot, Poland; Robert Hannon, Wappingers Falls, N.Y.; Lester Wynn Herron, Hopewell Junction, N.Y.; Gregory Marvin Johnson; Andrew Michael Reitter, both of Poughkeepsie, N.Y.; Subhash Laxman Shinde, Ossining, N.Y.; Lisa Michelle Studzinski, Wappingers Falls, N.Y.

[73] Assignee: International Business Machines Corporation, Armonk, N.Y.

[21] Appl. No.: 08/819,928

[22] Filed: Mar. 18, 1997

[51] Int. Cl.$^6$ .............................. B32B 31/20; B32B 15/04
[52] U.S. Cl. .................................... 156/89.15; 156/89.19; 156/289; 264/618; 264/619; 428/472
[58] Field of Search ................................ 156/89.15, 289, 156/89.16, 537, 89.19, 89.21; 264/614, 618, 619; 501/98.4, 98.5; 428/472

[56] References Cited

U.S. PATENT DOCUMENTS

| | | |
|---|---|---|
| 4,618,592 | 10/1986 | Kuramoto et al. . |
| 5,063,121 | 11/1991 | Sato et al. . |
| 5,165,983 | 11/1992 | Sugiura et al. . |
| 5,242,872 | 9/1993 | Taniguchi et al. . |
| 5,283,214 | 2/1994 | Knudsen . |
| 5,424,261 | 6/1995 | Harris et al. . |
| 5,482,903 | 1/1996 | Duncombe et al. . |
| 5,540,884 | 7/1996 | Chiao . |
| 5,541,145 | 7/1996 | Harris et al. . |
| 5,656,113 | 8/1997 | Ikeda et al. . |
| 5,683,529 | 11/1997 | Makihara et al. . |

FOREIGN PATENT DOCUMENTS

| | | |
|---|---|---|
| 3-197367 | 8/1991 | Japan . |
| 3-211046 | 9/1991 | Japan . |
| 3-275567 | 12/1991 | Japan . |
| 5-310476 | 11/1993 | Japan . |
| 7-247171 | 9/1995 | Japan . |

*Primary Examiner*—Curtis Mayes
*Attorney, Agent, or Firm*—Aziz M. Ahsan

[57] ABSTRACT

A method and apparatus for flattening a ceramic body comprised primarily of an aluminum nitride system having a liquid phase additive necessary for low temperature sintering during a firing thereof is disclosed. The ceramic body is referred to as an aluminum nitride multilayer ceramic (AlN MLC). The method and apparatus include a support tile having a first coating on a contact surface thereof, the AlN MLC for being placed upon the contact surface of the support tile. A load flattening tile having a second coating on a contact surface thereof is provided, the load flattening tile for being placed with its coated surface upon and in contact with the AlN MLC. Lastly, a furnace is provided for heating the support tile, AlN MLC, and load flattening tile at temperatures greater than 1500° C. for an amount of time necessary to flatten the ceramic body to a desired degree of flatness, wherein the first coating and the second coating of the support tile and the load flattening tile, respectively, react with the AlN MLC for quenching the liquid phase of the ceramic body to prevent a sticking of the support tile and the load flattening tile to the AlN MLC during a flattening process.

53 Claims, 1 Drawing Sheet

METHOD FOR FLAT FIRING ALUMINUM NITRIDE/TUNGSTEN ELECTRONIC MODULES

BACKGROUND OF THE INVENTION

1. Field of the Invention

This invention relates generally to ceramic bodies having electrical characteristics suitable for use as substrates for electronic packaging applications. More particularly, the invention is directed to a method and apparatus for preventing damage to sintered aluminum nitride substrates resulting from undesirable sticking during flattening or weighted sintering of the substrates. The flattened ceramic AlN substrates are particularly useful for multilayer metal-ceramic based microelectronic packages.

2. Discussion of the Related Art

As compared to alumina, the commercially predominant electronic ceramic, aluminum nitride ceramics potentially possess superior characteristics for electronic packaging applications with respect to electrical insulation, high thermal conductivity (above 120 W/m-K), thermal expansion match to silicon devices, and low dielectric constant. Aluminum nitride substrates are potentially useful where high heat dissipation is required in a microelectronic package, such as in a multilayer metal-ceramic package for high power devices. Aluminum nitride ceramics for microelectronic applications must therefore be capable of accommodating metallized components, polymeric layers and heat generating, high power electronic devices.

Aluminum nitride ceramics are prepared from aluminum nitride powders. In order to achieve suitable properties, the AlN ceramic must achieve a certain density of at least about 90%, and preferably greater than or equal to about 95%. Aluminum nitride with no sintering additives cannot densify to high density due to its very high equilibrium vapor pressure at sintering temperatures (on the order of 1850° C.). However, densification can be achieved at lower temperatures by the use of sintering aids.

Sintering aids liquefy at temperatures below the decomposition and pure compound sintering temperatures for the ceramic, and promote densification of the ceramic grains by i) a particle rearrangement process mediated by capillary forces between the wetting liquid and the solid particles, and thereafter, ii) a dissolution and precipitation process. In this process, solid is preferentially dissolved at regions of high curvature (small particles) and redeposited at regions of low curvature (large particles). In addition, solid is preferentially dissolved at regions of solid-solid contact and redeposited away from the contact areas. At the later stages of the liquid sintering cycle, microstructure is refined via grain growth and coalescence processes.

Different combinations of sintering aids provide various compounds in situ which melt at different temperatures. The temperatures at which sintering occurs has an effect on the progress of the different types of sintering processes, and thus the microstructure and the final properties of the sintered ceramic body. Sintering aids also function to increase thermal conductivity of the sintered aluminum nitride body by gettering oxygen from the aluminum nitride powder. Thus, an effective sintering additive must form a liquid at a low temperature capable of dissolving and reprecipitating aluminum nitride without oxidation of the aluminum nitride. Not every liquid at sintering temperature will be able to getter oxygen and densify the ceramic.

All commercially available aluminum nitride powders contain oxygen as an impurity. This oxygen primarily takes two forms in the powder, as an alumina coating on each of the powder particles, and as dissolved oxygen impurity within the crystalline lattice of the aluminum nitride particles. A minor amount will be tied up as an oxide of any metal impurities which may be present. At a given sintering temperature, only a certain amount of oxygen, primarily from surface alumina and secondarily from other sources, will be available for reaction (hereinafter "available oxygen").

Upon densification, the volume of the green body, and for multilayer structures the volume of the metal lamina contained in the green body, together with the linear dimensions of the body, decrease as a function of both the temperature experienced and the particular material involved. If the metal and ceramic shrink at different rates, this shrinkage mismatch leads to residual stresses between the different constituent materials in the sintered body and distorts the final shape of the body. In order to maintain the exacting geometric tolerances required by the electronic packaging industry for multilayer ceramic based packages, it is necessary that the ceramic and the metal sinter at approximately the same rate.

An example of sintering of aluminum nitride at particularly low temperatures to mediate problems associated with different sintering rates and thermal expansion mismatches between the ceramic and metal portions of a multilayer electronic package is disclosed in U.S. Pat. No. 5,541,145, entitled Low Temperature Sintering Route for Aluminum Nitride Ceramics, issued Jul. 30, 1996, and incorporated herein by reference. In particular, an aluminum nitride ceramic having desired properties suitable for electronic packaging applications is prepared from an aluminum nitride powder/sintering aid mixture. The sintering aid includes a liquid component formed from alumina, calcia and boria, and a non-vitreous component including an element or compound of a metal of Group IIa, IIIa, or the lanthanides (rare earth metal compounds). The sintering aid may also include a multi-component liquid composition capable of forming the above components upon melting and thereafter crystallizing upon reaction.

Sintering aids are used to form an effective sintering liquid needed to density the ceramic and to remove dissolved oxygen from the AlN lattice. The sintering aids may also contribute to the formation of an additional phase or additional phases within the AlN structure which include reaction products of the sintering aid(s), aluminum and oxygen. For instance, second phase compositions have been found in sintered aluminum nitride ceramic bodies following sintering, including the presence of a residual calcium-aluminate containing species or calcium containing component. The calcium containing second phase may include a pseudo-quaternary compound containing Ca, Y, Al, and O and have substitutional boron contained within the compound, the second phase being in contact with the aluminum nitride at a dihedral angle sufficient to provide a resistivity of at least $10^8$ ohm-cm. Aluminum nitride sintered bodies can have enhanced properties using appropriate sintering aid packages within the sintering system even at low maximum sintering temperature, such as 1550° C.–1700° C., as disclosed in U.S. Pat. No. 5,541,145. This temperature regime is suitable for the simultaneous sintering of multiple metal and ceramic layers known in the art as co-fired multilayer electronic packages. As used herein, the term "low temperature" as it relates to sintered AlN bodies means an AlN body which is sintered at temperatures (<1700° C.) which are comparatively lower than temperatures at which the body would typically be sintered.

Further in connection with the manufacture of multi-layer electronic substrate modules, a nonuniform metal loading on a single layer and/or the layer to layer metal loading variation can lead to camber development in sintered parts even when the metal/ceramic systems are matched in their sintering behavior. The camber increases rapidly as the metal and ceramic systems deviate in their sintering behavior. Flattening or flat firing is therefore a common step after sintering, where the sintered parts are heated to an appropriate temperature under a flattening weight. The parts are thus flattened according to desired and/or required flatness specifications.

One of the major yield detractors in the flattening process is the undesirable sticking of setters (i.e., flattening weights) to the ceramic modules and/or substrates being flattened. Sticking leads to parts distortion, breakage and cracking. For aluminum nitride ceramic modules, the problem of sticking is particularly severe. It has been observed that aluminum nitride modules stick to molybdenum (Mo) setters during flattening, leading to cracking, spalling and fracture of parts, in some instances.

SUMMARY OF THE INVENTION

It is an object of the present invention to provide a method and apparatus for providing a high yield flattening process of aluminum nitride ceramic modules.

It is a further object for minimizing a sticking of the aluminum nitride ceramic modules to setters during a flattening process.

In accordance with the present invention, a method of flattening a ceramic body comprised primarily of an aluminum nitride system is disclosed. The aluminum nitride system includes a liquid phase additive necessary for low temperature sintering during a firing thereof, the ceramic body further being referred to as an aluminum nitride multilayer ceramic (AlN MLC). The method includes the steps of providing a support tile having a first coating on a contact surface thereof. The AlN MLC is placed upon the contact surface of the support tile. A load flattening tile is provided, the load flattening tile having a second coating on a contact surface thereof. The load flattening tile is placed upon the AlN MLC with the load flattening tile's contact surface in contact with the AlN MLC. The support tile, AlN MLC, and load flattening tile are placed in a furnace at temperatures greater than 1500° C. for an amount of time necessary to flatten the ceramic body to a desired degree of flatness, wherein the first coating and the second coating of the support tile and the load flattening tile, respectively, react with the AlN MLC for quenching the liquid phase of the ceramic body to prevent a sticking of the support tile and the load flattening tile to the AlN MLC during the flattening process.

In addition, an apparatus for flattening a ceramic body comprised primarily of an aluminum nitride system having a liquid phase additive necessary for low temperature sintering during a firing thereof is disclosed. The ceramic body is hereafter referred to as an aluminum nitride multilayer ceramic (AlN MLC). The apparatus includes a support tile having a first coating on a contact surface thereof, the AlN MLC for being placed upon the contact surface of the support tile. A load flattening tile having a second coating on a contact surface thereof is provided. The load flattening tile is for being placed with its contact surface upon and in contact with the AlN MLC. A furnace is provided for heating the support tile, AlN MLC, and load flattening tile at temperatures greater than 1500° C. for an amount of time necessary to flatten the ceramic body to a desired degree of flatness, wherein the first coating and the second coating of the support tile and the load flattening tile, respectively, react with the AlN MLC for quenching the liquid phase of the ceramic body to prevent a sticking of the support tile and the load flattening tile to the AlN MLC during a flattening process.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawing figures, in which.

DETAILED DESCRIPTION OF A PREFERRED EMBODIMENT OF THE INVENTION

The present invention relates to sintering AlN formation technology and the flattening thereof. The present invention further relates to the weighted sintering of AlN ceramic modules and substrates. In these processes, sticking has been found to result from chemical, as well as physical interaction between the setters and ceramic modules and/or substrates. In conjunction with the present invention, it has been established that the sticking or adhesion of aluminum nitride (AlN) to molybdenum (Mo) results from the liquid phase in AlN (corresponding to a Yttrium, Calcium, Aluminate liquid) interacting with the surface of Mo setters. Sticking during even a portion of the flattening process or weighted sintering process has resulted in and led to undesirable localized cracking and/or distortion. The AlN modules may also include AlN/tungsten (W) cofired modules. While the term module is used herein throughout, it shall be interpreted to include any ceramic substrate having internal and/or external metalizations.

In accordance with the present invention, one manner for controlling an interaction of the setter with the ceramic module being flattened is to coat the setter with a compound, which when in contact with the AlN module during a flattening process, changes the liquid phase composition locally (i.e., near the surface of the AlN module) and increase its melting point. This advantageously quenches the liquid phase compositionally and eliminates the undesirable sticking. The method and apparatus according to the present invention more particularly involves using yttria coated Mo setters during the flattening process. Yttria is a component of the Ca—Y—Al—O liquid phase in the AlN system as discussed above. An increase in the yttria concentration at the surface of the AlN MLC module, resulting from the yttria coating on respective contacting surfaces of the Mo setters, creates a higher melting liquid phase than would normally occur in the absence of the yttria coating on the Mo setters. The higher melting liquid phase has been estimated to be as much as 50 to 100° C. higher. It has further been found that parts (i.e., AlN MLC modules) flattened with the yttria coated Mo setters according to the present invention result in no undesired sticking. Another advantage of using the yttria coated Mo setters is that the resultant higher melting liquid phase can further also result in a dewetted microstructure which leads to AlN with very high electrical resistivity. Elimination of sticking further reduces substrate distortion and the oxygen gettering by yttria improves the thermal conductivity of AlN.

As indicated herein above, the present invention is applicable for use with AlN/W cofire modules. The use of weights in accordance with the present invention includes Mo weights having a coating of yttria, the yttria coated weights further for being used on green sheets after a metal paste has been applied, so as to keep the paste surface flat.

Figure 1:
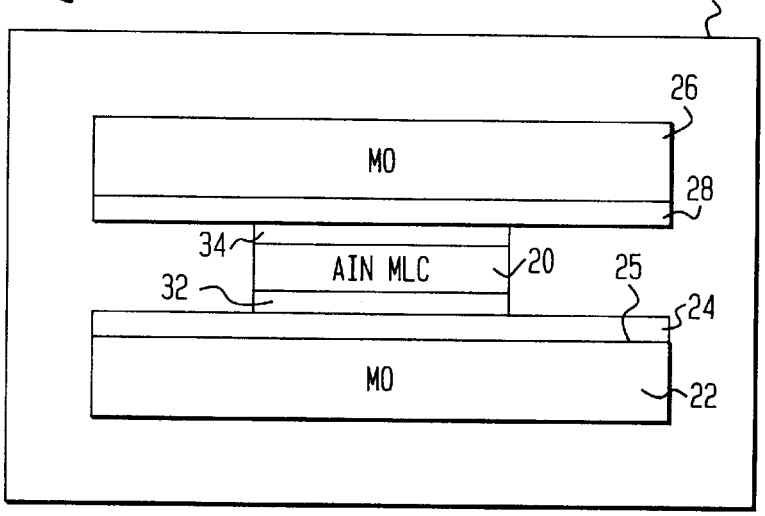
FIG. 1 shows a flattening apparatus in accordance with the present invention and for carrying out the method of the present invention.

Turning now to FIG. 1, in accordance with the present invention, an apparatus 10 for flattening a ceramic body 20 shall be described. Ceramic body 20 is comprised primarily of an aluminum nitride system having a liquid phase additive necessary for low temperature sintering during a firing thereof, as previously discussed herein above. The ceramic body 20 can also be referred to as an aluminum nitride multilayer ceramic (AlN MLC).

Apparatus 10 includes a support tile 22 corresponding to a setter or weight as used during the flattening process. Support tile 22 may include molybdenum (Mo), tantalum (Ta), tungsten (W), hafnium (Hf), or an alloy thereof. Molybdenum has a density on the order of 10.2 grams/cm$^3$ tantalum has a density on the order of 16.6 grams/cm$^3$, tungsten has a density on the order of 19.3 grams/cm$^3$, and hafnium has a density on the order of 13.1 grams/cm$^3$. Support tile 22 further includes a first coating 24 on a surface 25 thereof. Coating 24 preferably includes a yttria ($Y_2O_3$) layer. In one embodiment, the first coating 24 is applied to the support tile 22 by spraying an aerosol spray of yttria and further containing a low amount of binder corresponding to a range of 0 to 2% (percent) by weight of binder, preferably around 0.5%. Alternatively, the first coating 24 can be applied to the support tile 22 by plasma spraying or any other suitable thin/thick film coating process. Suitable aerosol spraying, plasma spraying, and thin/thick film coating techniques are known in the art. The AlN MLC 20 is placed upon the yttria coated surface of the support tile 22 during the flattening process.

Apparatus 10 further includes a load flattening tile 26 corresponding to a setter or weight as used also during the flattening process. Load flattening tile 26 may include molybdenum (Mo), tantalum (Ta), tungsten (W), hafnium (Hf), or an alloy thereof. Of the materials listed, the density thereof may be considered when selecting the appropriate material for a particular flattening operation, i.e., a higher density material would require a smaller volume than a lower density material. Load flattening tile 26 further includes a second coating 28 on a surface 29 thereof. Coating 28 preferably includes a yttria ($Y_2O_3$) layer. In one embodiment, the second coating 28 is applied to the load flattening tile 26 by spraying an aerosol spray of yttria, the aerosol spray further containing a low amount of binder corresponding to a range of 0 to 2% (percent) by weight of binder, preferably around 0.5%. Alternatively, the second coating 28 can be applied to the load flattening tile 26 by plasma spraying or any other suitable thin/thick film coating process. As indicated above, suitable aerosol spraying, plasma spraying, and thin/thick film coating techniques are known in the art. Load flattening tile 26 is placed with its yttria coated surface upon and in contact with the AlN MLC 20.

Apparatus 10 further includes a furnace 30 for heating the support tile 22, the AlN MLC 20, and the load flattening tile 26 at temperatures greater than 1500° C. for an amount of time necessary to flatten the ceramic body 20 to a desired degree of flatness. The yttria coating 24 of the support tile 22 and the yttria coating 28 of the load flattening tile 26, respectively, react with the AlN MLC 20 in surface regions 32 and 34 of the AlN MLC 20 for quenching the liquid phase of the ceramic body. The term "quenching" as used herein is to be interpreted as a changing of the composition of the liquid phase to a higher "yttrium" level which leads to an increased melting point and hence localized solidification of that phase. Quenching of the liquid phase of the ceramic body advantageously prevents a sticking of the support tile 22 and the load flattening tile 26 to the AlN MLC 20 during a flattening process.

The yttria of the first coating 24 and the yttria of the second coating 28 each reacts with and quenches a liquid sintering additive that evolves to a respective contacting surface of the AlN MLC part 20 during flattening. As a result, a shifting in a phase composition at the respective surface is shifted to a higher melting point phase.

Figure 2:
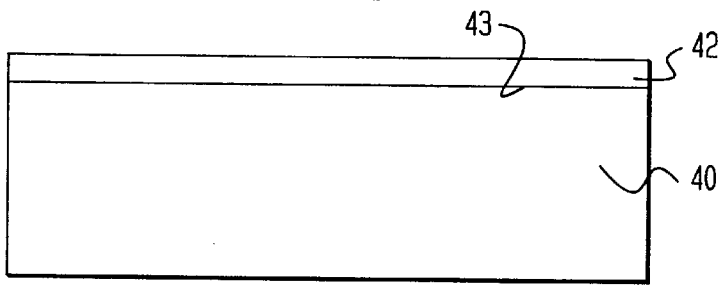
FIG. 2 illustrates a setter having a non-sticking coating in accordance with one embodiment of the present invention.

Turning now to FIG. 2, a setter 40 representative of the support tile 22 and/or the load flattening tile 26 as discussed herein above, is shown. Setter 40 includes a material selected from the group consisting of molybdenum (Mo), tantalum (Ta), tungsten (W), hafnium (Hf), and an alloy thereof. Setter 40 further includes a coating 42 on a surface 43 thereof. Coating 42 preferably includes a yttria ($Y_2O_3$) layer. Coating 42 is applied to the setter 40 by spraying an aerosol spray of yttria and further containing a low amount of binder corresponding to a range of 0 to 2% (percent) by weight of binder, preferably around 0.5%. Alternatively, coating 42 can be applied to the setter 40 by plasma spraying or any other suitable thin/thick film coating process.

Figure 3:
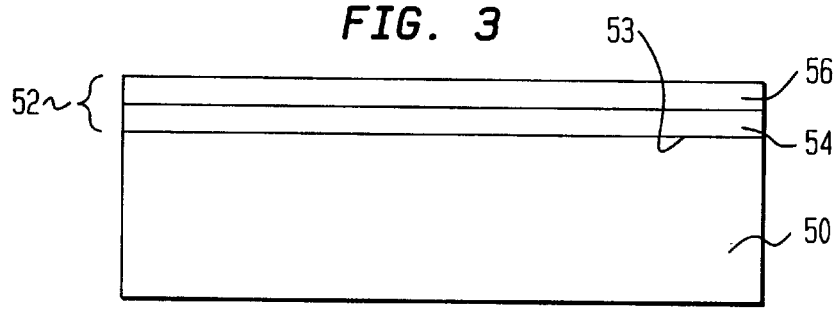
FIG. 3 illustrates a setter having a non-sticking composite coating in accordance with an alternate embodiment of the present invention.

Referring now to FIG. 3, an alternate setter 50 representative of the support tile 22 and/or the load flattening tile 26 as discussed herein above, is shown. Setter 50 includes a material selected from the group consisting of molybdenum (Mo), tantalum (Ta), tungsten (W), hafnium (Hf), and an alloy thereof. Setter 50 further includes a composite coating 52 on a surface 53 thereof. Composite coating 52 preferably includes a first composite yttria ($Y_2O_3$) layer 54 and a second composite yttria ($Y_2O_3$) layer 56 on top of the first layer 54, as discussed in the following. The first composite yttria ($Y_2O_3$) layer 54 includes a composite of the setter material and 10–50% (percent) yttria ($Y_2O_3$), preferably 30%. The second composite yttria ($Y_2O_3$) layer 56 includes a composite of the setter material and 40–100% (percent) yttria ($Y_2O_3$), preferably 60%. Composite coating 52 is applied to the setter 50 by any suitable coating processes, such as plasma spraying. The composite layer 52 is much more resistant to wear and requires much less rework (i.e., reconditioning of the setter after a certain determined usage) than when a yttria coating is used alone, as shown in FIG. 2.

Figure 4:
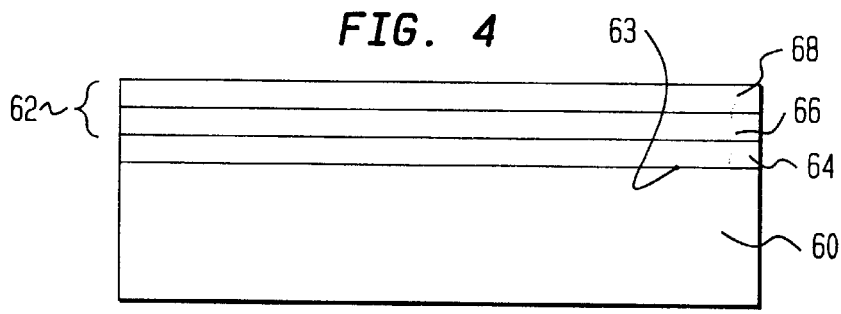
FIG. 4 illustrates a setter having a non-sticking composite coating in accordance with yet another alternate embodiment of the present invention.

Turning now to FIG. 4, yet another alternate setter 60 representative of the support tile 22 and/or the load flattening tile 26 as discussed herein above, is shown. Setter 60 is similar to setter 50 of FIG. 3, and further includes an adhesion promotion layer 64 between a surface 63 of setter 60 and composite coating 62. The adhesion promotion layer 64 preferably includes a plasma sprayed coating consisting of a same material as that of the setter. That is, if the setter material is molybdenum, the adhesion promotion layer is selected to be plasma sprayed molybdenum, etc. Such an adhesion promotion layer renders the setter 60 more robust.

Composite coating 62 preferably includes a first composite yttria (Y$_2$O$_3$) layer 66 and a second composite yttria (Y$_2$O$_3$) layer 68 on top of the first layer 66, as discussed in the following. The first composite yttria (Y$_2$O$_3$) layer 66 includes a composite of the setter material and 10–50% (percent) yttria (Y$_2$O$_3$), preferably 30%. The second composite yttria (Y$_2$O$_3$) layer 68 includes a composite of the setter material and 40–100% (percent) yttria (Y$_2$O$_3$), preferably 60%. Composite coating 62 is applied by suitable coating processes, such as plasma spraying. As with the composite layer 52 of FIG. 3, the composite layer 62 of FIG. 4 is also much more resistant to wear and requires much less rework.

The yttria coated setters as discussed hereinabove are equally applicable for use in the weighted sintering of AlN modules or substrates. Briefly, weighted sintering or stacked sintering involves the process of sintering a green laminate under a weighted constraint, the green laminate having previously had any organic binder removed therefrom. The green laminate is placed upon a support setter and a second setter placed upon the green laminate provides a suitable weight during sintering. The use of the yttria coated setters advantageously eliminate undesirable sticking and further reduces the potential for local distortions during weighted sintering.

Prior to the present invention, no other suitable method has been known for preventing the undesirable sticking of the setter to the AlN substrate during flattening and/or weighted sintering. As a result, yield loss and degradation of finished product have heretofore been undesirably accepted.

There has thus been shown a method and apparatus which overcomes the problem in the art and for preventing undesirable sticking or adhesion of flattening tiles or weights to ceramic bodies being fired, especially aluminum nitride. In summary, the method of the present invention includes coating of setter tiles with yttria for use during the flattening firing cycle of AlN substrates. Coating advantageously provides compositional quenching of liquid phase to prevent formation and sticking. The present invention thus advantageously improves yield and quality of finished product, i.e., improves yield for flattened AlN products. Furthermore, the yttria coated load flattening and support tiles are reusable, thus the present invention further provides a simple and economical solution.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of flattening a ceramic body comprised primarily of an aluminum nitride system having a liquid phase additive necessary for low temperature sintering during a firing thereof, the ceramic body being referred to as an aluminum nitride multilayer ceramic (AlN MLC), said method comprising the steps of:

providing a support tile having a first coating on a contact surface thereof;

placing the AlN MLC upon the contact surface of the support tile;

providing a load flattening tile having a second coating on a contact surface thereof and placing the load flattening tile with its contact surface upon and in contact with the AlN MLC; and heating the support tile, AlN MLC, and load flattening tile in a furnace at temperatures greater than 1500° C. for an amount of time necessary to flatten the ceramic body to a desired degree of flatness, wherein the first coating and the second coating of the support tile and the load flattening tile, respectively, react with the AlN MLC for quenching the liquid phase of the ceramic body to prevent a sticking of the support tile and the load flattening tile to the AlN MLC during the flattening process.

2. The method of claim 1, wherein the first coating includes a yttria (Y$_2$O$_3$) layer, and the second coating includes a yttria (Y$_2$O$_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

3. The method of claim 2, further wherein the first coating is applied to the support tile by spraying an aerosol spray containing a low amount of binder corresponding to a range of 0 to 2.0% (percent) by weight of binder.

4. The method of claim 2, further wherein the second coating is applied to the load flattening tile by spraying an aerosol spray containing a low amount of binder corresponding to a range of 0 to 2.0% (percent) by weight of binder.

5. The method of claim 2, further wherein the first coating is applied to the support tile by plasma spraying.

6. The method of claim 2, further wherein the second coating is applied to the load flattening tile by plasma spraying.

7. The method of claim 2, further wherein the support tile includes a material selected from the group consisting of molybdenum (Mo), tantalum (Ta), tungsten (W), hafnium (Hf), and an alloy thereof.

8. The method of claim 2, further wherein the load flattening tile includes a material selected from the group consisting of molybdenum (Mo), tantalum (Ta), tungsten (W), hafnium (Hf), and an alloy thereof.

9. The method of claim 1, wherein the first coating includes a first composite yttria (Y$_2$O$_3$) layer and a second composite yttria (Y$_2$O$_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria (Y$_2$O$_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

10. The method of claim 1, wherein the first coating includes a yttria ($Y_2O_3$) layer, and the second coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the load flattening tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

11. The method of claim 1, wherein the first coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

12. The method of claim 1, wherein the first coating includes a yttria ($Y_2O_3$) layer, and the second coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the load flattening tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

13. An apparatus for flattening a ceramic body comprised primarily of an aluminum nitride system having a liquid phase additive necessary for low temperature sintering during a firing thereof, the ceramic body being referred to as an aluminum nitride multilayer ceramic (AlN MLC), said apparatus comprising:

a support tile having a first coating on a contact surface thereof, the AlN MLC for being placed upon the contact surface of said support tile;

a load flattening tile having a second coating on a contact surface thereof, the load flattening tile for being placed with its contact surface upon and in contact with the AlN MLC; and a furnace for heating said support tile, the AlN MLC, and said load flattening tile at temperatures greater than 1500° C. for an amount of time necessary to flatten the ceramic body to a desired degree of flatness, wherein the first coating and the second coating of said support tile and said load flattening tile, respectively, react with the AlN MLC for quenching the liquid phase of the ceramic body to prevent a sticking of said support tile and said load flattening tile to the AlN MLC during a flattening process.

14. The apparatus of claim 13, wherein the first coating includes a yttria ($Y_2O_3$) layer, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

15. The apparatus of claim 14, further wherein the first coating is an aerosol spray coating applied to said support tile, the aerosol spray coating containing a low amount of binder corresponding to a range of 0 to 2.0% (percent) by weight of binder.

16. The apparatus of claim 14, further wherein the second coating is an aerosol spray coating applied to said load flattening tile, the aerosol spray coating containing a low amount of binder corresponding to a range of 0 to 2.0% (percent) by weight of binder.

17. The apparatus of claim 14, further wherein the first coating is a plasma sprayed coating applied to said support tile.

18. The apparatus of claim 14, further wherein the second coating is a plasma sprayed coating applied to said load flattening tile.

19. The apparatus of claim 14, further wherein said support tile includes a material selected from the group consisting of molybdenum (Mo), tantalum (Ta), tungsten (W), hafnium (Hf), and an alloy thereof.

20. The apparatus of claim 14, further wherein said load flattening tile includes a material selected from the group consisting of molybdenum (Mo), tantalum (Ta), tungsten (W), hafnium (Hf), and an alloy thereof.

21. The apparatus of claim 13, wherein the first coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

22. The apparatus of claim 13, wherein the first coating includes a yttria ($Y_2O_3$) layer, and the second coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the load flattening tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

23. The apparatus of claim 13, wherein the first coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

24. The apparatus of claim 13, wherein the first coating includes a yttria ($Y_2O_3$) layer, and the second coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the load flattening tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

25. A method of weighted sintering of a ceramic body comprised primarily of an aluminum nitride system having a liquid phase additive necessary for low temperature sintering during a firing thereof, the ceramic body being referred to as an aluminum nitride multilayer ceramic (AlN MLC), said method comprising the steps of:

providing a support tile having a first coating on a contact surface thereof;

placing the AlN MLC upon the contact surface of the support tile;

providing a load weighting tile having a second coating on a contact surface thereof and placing the load weighting tile with its contact surface upon and in contact with the AlN MLC; and heating the support tile, AlN MLC, and load weighting tile in a furnace at a temperature greater than 1500° C. for an amount of time necessary to sinter the ceramic body, wherein the first coating and the second coating of the support tile and the load weighting tile, respectively, react with the AlN MLC for quenching the liquid phase of the ceramic body to prevent a sticking of the support tile and the load weighting tile to the AlN MLC during the weighted sintering process.

26. The method of claim 25, wherein the first coating includes a yttria ($Y_2O_3$) layer, and the second coating includes a yttria ($Y_2O_3$) layer, further wherein the yttria of the first coating and the yttria of the second coating each reacts with and quenches a liquid sintering additive that evolves to a respective contact surface of the AlN part during weighted sintering, thereby shifting a phase composition at the respective surface to a higher melting point phase.

27. The method of claim 26, further wherein the first coating is applied to the support tile by spraying an aerosol spray containing a low amount of binder corresponding to a range of 0 to 2.0% (percent) by weight of binder.

28. The method of claim 26, further wherein the second coating is applied to the load weighting tile by spraying an aerosol spray containing a low amount of binder corresponding to a range of 0 to 2.0% (percent) by weight of binder.

29. The method of claim 26, further wherein the first coating is applied to the support tile by plasma spraying.

30. The method of claim 26, further wherein the second coating is applied to the load weighting tile by plasma spraying.

31. The method of claim 26, further wherein the support tile includes a material selected from the group consisting of molybdenum (Mo), tantalum (Ta), tungsten (W), hafnium (Hf), and an alloy thereof.

32. The method of claim 26, further wherein the load weighting tile includes a material selected from the group consisting of molybdenum (Mo), tantalum (Ta), tungsten (W), hafnium (Hf), and an alloy thereof.

33. The method of claim 25, wherein the first coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

34. The method of claim 25, wherein the first coating includes a yttria ($Y_2O_3$) layer, and the second coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the load weighting tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

35. The method of claim 25, wherein the first coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

36. The method of claim 25, wherein the first coating includes a yttria ($Y_2O_3$) layer, and the second coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the load weighting tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

37. An apparatus for weighted sintering of a ceramic body comprised primarily of an aluminum nitride system having a liquid phase additive necessary for low temperature sintering during a firing thereof, the ceramic body being referred to as an aluminum nitride multilayer ceramic (AlN MLC), said apparatus comprising:

a support tile having a first coating on a contact surface thereof, the AlN MLC for being placed upon the contact surface of said support tile;

a load weighting tile having a second coating on a contact surface thereof, the load weighting tile for being placed with its contact surface upon and in contact with the AlN MLC; and a furnace for heating said support tile, the AlN MLC, and said load weighting tile at a temperature greater than 1,500° C. for an amount of time necessary to sinter the ceramic body, wherein the first coating and the second coating of said support tile and said load weighting tile, respectively, react with the AlN MLC for quenching the liquid phase of the ceramic body to prevent a sticking of said support tile and said load weighting tile to the AlN MLC during a weighted sintering process.

38. The apparatus of claim 37, wherein the first coating includes a yttria ($Y_2O_3$) layer, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

39. The apparatus of claim 38, further wherein the first coating is an aerosol spray coating applied to said support tile, the aerosol spray coating containing a low amount of binder corresponding to a range of 0 to 2.0% (percent) by weight of binder.

40. The apparatus of claim 38, further wherein the second coating is an aerosol spray coating applied to said load flattening tile, the aerosol spray coating containing a low amount of binder corresponding to a range of 0 to 2.0% (percent) by weight of binder.

41. The apparatus of claim 38, further wherein the first coating is a plasma sprayed coating applied to said support tile.

42. The apparatus of claim 38, further wherein the second coating is a plasma sprayed coating applied to said load weighting tile.

43. The apparatus of claim 38, further wherein said support tile includes a material selected from the group consisting of molybdenum (Mo), tantalum (Ta), tungsten (W), hafnium (Hf), and an alloy thereof.

44. The apparatus of claim 38, further wherein said load weighting tile includes a material selected from the group consisting of molybdenum (Mo), tantalum (Ta), tungsten (W), hafnium (Hf), and an alloy thereof.

45. The apparatus of claim 37, wherein the first coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

46. The apparatus of claim 37, wherein the first coating includes a yttria ($Y_2O_3$) layer, and the second coating includes a first composite yttria ($Y_2O_3$) layer and a second composite yttria ($Y_2O_3$) layer on top of the first yttria composite layer, the first composite yttria layer including a composite of a setter material and 10–50% (percent) yttria, the setter material corresponding to a material of the load weighting tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

47. The apparatus of claim 37, wherein the first coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the support tile, and the second composite yttria layer including a composite of the setter material and 40–100% (percent) yttria, and the second coating includes a yttria ($Y_2O_3$) layer, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

48. The apparatus of claim 37, wherein the first coating includes a yttria ($Y_2O_3$) layer, and the second coating includes an adhesion promoting layer, a first composite yttria ($Y_2O_3$) layer on top of the adhesion promoting layer and a second composite yttria ($Y_2O_3$) layer on top of the first yttria composite layer, the first composite yttria layer including a composite of a setter material and 10–50% (percent) yttria, the setter material corresponding to a material of the load weighting tile, and the second composite yttria layer including a composite of the setter material and 40–100% (percent) yttria, further wherein the yttria of the first coating and the yttria of the second coating each reacts with and quenches a liquid sintering additive that evolves to a respective contact surface of the AlN part during flattening, thereby shifting a phase composition at the respective surface to a higher melting point phase.

49. A structure comprising a tile, said tile having at least one layer of a first material contiguously secured to a surface of said tile, and wherein said structure is capable of withstanding temperatures greater than 1500° C., and wherein an adhesion promotion layer secures said at least one layer of said first material to said tile.

50. The structure of claim 49, wherein said structure is capable of withstanding temperatures between 1500° C. and 1850° C.

51. The structure of claim 49, wherein material for said adhesion Promotion layer is different than material for said tile.

52. The structure of claim 49, wherein material for said adhesion promotion layer is same as material for said tile.

53. The structure of claim 49, wherein material for said at least one layer of said first material is selected from the group consisting of yttria and composites of yttria and the material of said tile.

* * * * *